United States Patent
Pribble et al.

(10) Patent No.: US 9,407,214 B2
(45) Date of Patent: Aug. 2, 2016

(54) MMIC POWER AMPLIFIER

(71) Applicant: Cree, Inc., Durham, NC (US)

(72) Inventors: William Pribble, Apex, NC (US); James Milligan, Cary, NC (US); Simon Wood, Raleigh, NC (US)

(73) Assignee: Cree, Inc., Durham, NC (US)

( * ) Notice: Subject to any disclaimer, the term of this patent is extended or adjusted under 35 U.S.C. 154(b) by 6 days.

(21) Appl. No.: 13/930,544

(22) Filed: Jun. 28, 2013

(65) Prior Publication Data

US 2015/0002227 A1 Jan. 1, 2015

(51) Int. Cl.
- *H03F 3/21* (2006.01)
- *H03F 3/195* (2006.01)
- *H03F 1/56* (2006.01)
- *H03F 1/02* (2006.01)
- *H03F 3/24* (2006.01)

(52) U.S. Cl.
CPC .............. *H03F 3/195* (2013.01); *H03F 1/0288* (2013.01); *H03F 1/56* (2013.01); *H03F 3/245* (2013.01); *H03F 2200/387* (2013.01)

(58) Field of Classification Search
USPC .......... 330/295, 124 R, 302, 286, 84
See application file for complete search history.

(56) References Cited

U.S. PATENT DOCUMENTS

| | | | |
|---|---|---|---|
| 6,316,793 B1 | 11/2001 | Sheppard et al. | |
| 6,469,581 B1 | 10/2002 | Kobayashi | |
| 6,548,333 B2 | 4/2003 | Smith | |
| 6,586,781 B2 | 7/2003 | Wu et al. | |
| 6,700,444 B2 | 3/2004 | Pengelly | |
| 6,737,922 B2 | 5/2004 | Pengelly et al. | |
| 6,791,417 B2 | 9/2004 | Pengelly et al. | |
| 6,849,882 B2 | 2/2005 | Chavarkar et al. | |
| 7,053,706 B2 * | 5/2006 | Kwon et al. | 330/124 R |
| 7,126,426 B2 | 10/2006 | Mishra et al. | |
| 7,193,473 B2 | 3/2007 | Pengelly et al. | |
| 7,230,284 B2 | 6/2007 | Parikh et al. | |
| 7,501,669 B2 | 3/2009 | Parikh et al. | |
| 7,550,783 B2 | 6/2009 | Wu et al. | |

(Continued)

FOREIGN PATENT DOCUMENTS

| WO | WO 97/20385 A1 | 6/1997 |
|---|---|---|
| WO | WO 2012/143748 A1 | 10/2012 |

OTHER PUBLICATIONS

Gustafsson et al.; *A Wideband and Compact GaN MMIC Doherty Amplifier for Microwave Link Applications*; IEEE Transactions on Microwave Theory and Techniques, vol. 61, No. 2, Feb. 2013, pp. 922-930.

(Continued)

*Primary Examiner* — Hieu Nguyen
(74) *Attorney, Agent, or Firm* — Myers Bigel & Sibley, P.A.

(57) ABSTRACT

A microwave integrated circuit includes a substrate and a power amplifier on the substrate. The power amplifier includes a power divider circuit having an input configured to receive an input RF signal, a base amplifier having an input coupled to a first output of the power divider circuit and a peaking amplifier having an input coupled to a second output of the power divider circuit and an output coupled to an output combining node. The power amplifier further includes an impedance inverter circuit coupling the output of the base amplifier to the output combining node and a load matching circuit having an input coupled to the output combining node and an output configured to be coupled to a load.

35 Claims, 9 Drawing Sheets

(56) References Cited

U.S. PATENT DOCUMENTS

| | | |
|---|---|---|
| 7,573,078 B2 | 8/2009 | Wu et al. |
| 2002/0167023 A1 | 11/2002 | Chavarkar et al. |
| 2003/0020092 A1 | 1/2003 | Parikh et al. |
| 2004/0145416 A1 | 7/2004 | Kwon et al. |
| 2006/0202272 A1 | 9/2006 | Wu et al. |
| 2007/0059873 A1 | 3/2007 | Chini et al. |
| 2007/0126502 A1 | 6/2007 | Louis |
| 2009/0167438 A1 | 7/2009 | Yang et al. |
| 2011/0210786 A1 | 9/2011 | Blednov |
| 2012/0105147 A1 | 5/2012 | Harris et al. |
| 2012/0235734 A1 | 9/2012 | Pengelly |
| 2014/0239346 A1* | 8/2014 | Green et al. .......... 257/192 |

OTHER PUBLICATIONS

Raab; *Efficiency of Doherty RF Power-Amplifier Systems*; IEEE Transactions on Broadcasting, Vo. BC-33, No. 3; Sep. 1987, pp. 77-83.

International Search Report and Written Opinion Corresponding to International Application No. PCT/US2014/044270; Date of Mailing: Oct. 30, 2014; 18 Pages.

Wongkomet N. et al. "A +31.5 dBm CMOS RF Doherty Power Amplifier for Wireless Communications", *IEEE Journal of Solid-State Circuits*, vol. 41, No. 12, Dec. 2006, p. 2852-2859.

\* cited by examiner

MMIC POWER AMPLIFIER

TECHNICAL FIELD

The present invention relates to high-frequency amplifiers and, more particularly, to power amplifiers.

BACKGROUND

High frequency power amplifiers are commonly used in communications, radar, and other radio frequency (RF) systems. It is generally desirable for such power amplifiers to have wide bandwidth and operate with high efficiency. For example, modern broadband wireless protocols, such as LTE (Long Term Evolution) and IEEE 802.11ac, often involve transmission of broadband modulated waveforms that have high peak-to-average ratios. High efficiency over a relatively wide output power range is generally desirable for such applications.

Doherty amplifiers may be well-suited for such applications. Various Doherty amplifier implementations are described in U.S. Pat. No. 6,700,444 to Pengelly, U.S. Pat. No. 6,737,922 to Pengelly et al., U.S. Pat. No. 6,791,417 to Pengelly et al., U.S. Pat. No. 7,193,473 to Pengelly et al., and "A Wideband and Compact GaN MMIC Doherty Amplifier for Microwave Link Applications" by Gustafsson et al., *IEEE Transactions on Microwave Theory and Techniques*, Vol. 61, No. 2 (February 2013).

SUMMARY

Some embodiments of the inventive subject matter provide a microwave integrated circuit (MMIC) including a substrate and a power amplifier including a power divider circuit on the substrate and having an input configured to receive an input RF signal. The power amplifier also includes a base amplifier on the substrate and having an input coupled to a first output of the power divider circuit and a peaking amplifier on the substrate and having an input coupled to a second output of the power divider circuit and an output coupled to an output combining node. The power amplifier further includes an impedance inverter circuit on the substrate coupling the output of the base amplifier to the output combining node and a load matching circuit on the substrate and having an input coupled to the output combining node and an output configured to be coupled to a load.

The impedance inverter circuit may prioritize optimization of loading of the base and peaking amplifiers over matching of the output combining node to the load. In some embodiments, an impedance at the output combining node may be substantially different than 50 ohms.

In some embodiments, the impedance inverter circuit may include at least one lumped inductor coupled between the output of the base amplifier and the output combining node. The at least one lumped inductor may include a spiral inductor. The impedance inverter circuit may further include at least one capacitor coupled between the output combining node and a biasing node.

In some embodiments, the impedance inverter circuit includes a first transmission line segment having a first terminal coupled to the output of the base amplifier, a spiral inductor having a first terminal coupled to a second terminal of the first transmission line, a second transmission line segment having a first terminal coupled to a second terminal of the spiral inductor and a second terminal coupled to the output combining node, a third transmission line segment having a first terminal coupled to the second terminal of spiral inductor and to the first terminal of the second transmission line segment and a capacitor having a first terminal coupled to a second terminal of the third transmission line segment and a second terminal coupled to a biasing node.

In some embodiments, the base and peaking amplifier may include respective first and second Group III-nitride based transistors. The first and second Group III-nitride based transistors may include respective first and second gallium nitride (GaN) high electron mobility transistors (HEMTs). The first GaN HEMT may have a gate periphery in a range of about 2 mm to about 3 mm and the second GaN HEMT may have a gate periphery in a range of about 4 mm to about 6 mm. The output of the base amplifier may include a drain of the first GaN HEMT and the output of peaking amplifier may include a drain of the second GaN HEMT.

In some embodiments, the MMIC may be configured to provide an average output power of at least about 10 W and a gain of at least about 15 dB in a range of frequencies from about 2.5 GHz to about 2.7 GHz. The substrate may have an area of less than about 15 mm$^2$ and the MMIC may be configured to provide an average output power of at least about 10 W.

Further embodiments provide a monolithic microwave integrated circuit (MMIC) including a substrate and a power amplifier including a power divider circuit on the substrate and having an input configured to receive an input RF signal. The power amplifier also includes a base amplifier on the substrate and having an input coupled to a first output of the power divider circuit and a peaking amplifier on the substrate and having an input coupled to a second output of the power divider circuit and an output coupled to an output combining node. The power amplifier further includes an impedance inverter circuit on the substrate coupling the output of the base amplifier to the output combining node and including a lumped inductor coupled between the output of the base amplifier and the output combining node and a capacitor coupled between the output combining node and a biasing node.

The impedance inverter circuit may further include a transmission line segment coupled in series with the lumped inductor. For example, the impedance inverter circuit may include a first transmission line segment coupling the output of the base amplifier to the lumped inductor and a second transmission line segment coupling the lumped inductor to the output combining node. The impedance inverter circuit may further include a transmission line segment coupled in series with the at least one capacitor.

In some embodiments, the impedance inverter circuit may include a first transmission line segment having a first terminal coupled to the output of the base amplifier and second terminal coupled to a first terminal of the lumped inductor, a second transmission line segment coupled between a second terminal of the lumped inductor and the output combining node and a third transmission line segment having a first terminal coupled to the second terminal of the lumped inductor and a second terminal coupled to the capacitor.

In further embodiments, capacitor includes a first capacitor, the biasing node includes a first biasing node, and the power amplifier further includes a load matching circuit including a fourth transmission line segment having a first terminal coupled to the output combining node, a second capacitor having a first terminal coupled to a second terminal of the fourth transmission line segment and a second terminal configured to be coupled to the external load, a fifth transmission line segment having a first terminal coupled to the first terminal of the second capacitor and the second terminal of the fourth transmission line segment, and a third capacitor coupled between a second terminal of the fifth transmission line segment and biasing node.

In some embodiments, the base and peaking amplifiers may include respective first and second Group III-nitride based transistors. The first and second Group III-nitride based transistors may include respective first and second gallium nitride (GaN) high electron mobility transistors (HEMTs). The first GaN HEMT may have a gate periphery in a range of about 2 mm to about 3 mm and wherein the second GaN HEMT may have a gate periphery in a range of about 4 mm to about 6 mm.

Further embodiments provide a MMIC as described coupled to an external load matching circuit.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DESCRIPTION OF EMBODIMENTS

Figure 1:
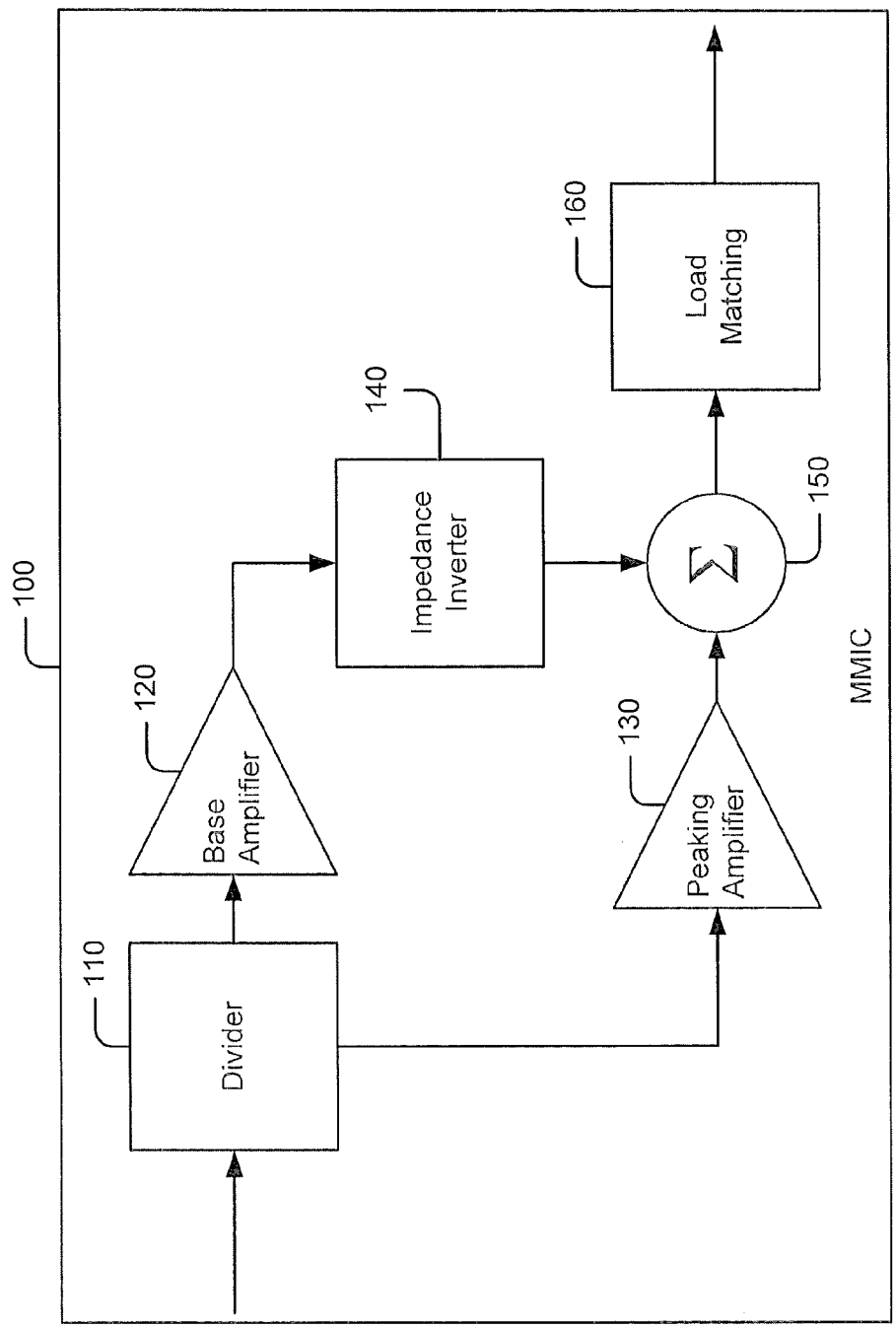
FIG. 1 is a schematic diagram illustrating a monolithic microwave integrated circuit (MMIC) with a Doherty amplifier according to some embodiments.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Group III nitrides refer to those semiconductor compounds formed between nitrogen and the elements in the Group III of the periodic table, usually aluminum (Al), gallium (Ga), and/or indium (In). The term also refers to ternary and quaternary compounds, such as AlGaN and AlInGaN.

Some embodiments of the inventive subject matter provide a monolithic microwave integrated circuit (MMIC) including a Doherty amplifier using base and peaking amplifiers fabricated on a single substrate along with an input divider circuit and an impedance inverter circuit coupled between an output of the base amplifier and an output combining node for the base and peaking amplifiers. The impedance inverter circuit may use a combination of lumped and distributed elements to limit circuit size and loss. In some embodiments, the impedance inverter circuit may include at least one lumped inductor coupled between the base amplifier output and the combining node. The MMIC may include a load matching circuit, such that the amplifier may be configured to provide an optimum or near optimum load at the output combining node by providing an impedance at the output combining node other than 50 ohms, thus providing additional freedom in the amplifier design. In some embodiments, the MMIC may be configured to use an external load matching circuit.

FIG. 1 is a block diagram of a RF power amplifier MMIC 100 according to some embodiments of the inventive subject matter. The MMIC 100 includes a power divider circuit 110 configured to receive an RF input signal. The power divider circuit 110 is coupled to inputs of a base amplifier 120 and a peaking amplifier 130. An impedance inverter circuit 140 couples an output of the base amplifier 110 to an output combining node 150. An output of the peaking amplifier 130 is also coupled to the output combining node 150. A load matching circuit 160 is coupled to the output combining node 150 and is configured to provide an RF output signal to a load, which may be an internal load (not shown) of the MMIC or an external load.

In some embodiments, the power divider circuit 110 may be a lumped Wilkinson power divider circuit. In some embodiments, the power divider circuit 110 may provide a substantially even power division between the base amplifier 120 and the peaking amplifier 130. In some embodiments, however, the power divider circuit 110 may provide a different power division. For example, the power division of the power divider circuit 110 and the biasing of the peaking amplifier can be varied to vary the turn-on power for the peaking amplifier and the knee of the output power/efficiency curve ("back-off" power level) of the Doherty amplifier.

The base amplifier 120 and the peaking amplifier 130 may include any of a variety of different types of amplifier circuits of varying complexity, from circuits including unmatched active devices (e.g., transistors) to matched and/or multistage circuits. In some embodiments, the base amplifier 120 and the peaking amplifier 130 may include Group-III nitride based transistors, such as GaN HEMTs. GaN HEMT structures that may be used in embodiments of the inventive subject matter are described in the following publications, the contents of each of which are incorporated herein by reference as if fully set forth herein: U.S. Pat. No. 6,849,882, entitled "Group-III nitride based high electron mobility transistor (HEMT) with barrier/spacer layer," issued Feb. 1, 2005; U.S. Pat. No. 7,230,284, entitled "Insulating gate AlGaN/GaN HEMT," issued Jun. 12, 2007; U.S. Publication No. 2007/0059873, entitled "Fabrication of single or multiple gate field plates," published Mar. 15, 2007; U.S. Pat. No. 7,550,783, entitled "Wide bandgap HEMTs with source connected field plates," issued Jun. 23, 2009; U.S. Publication No. 2006/0202272, entitled "Wide bandgap transistors with gate-source field plates," published Sep. 14, 2006; U.S. Pat. No. 7,501,669, entitled "Wide bandgap transistor devices with field plates," issued Mar. 10, 2009; U.S. Pat. No. 7,126,426, entitled "Cascode amplifier structures including wide bandgap field effect transistor with field plates," issued Oct. 24, 2006; and U.S. Pat. No. 7,573,078 entitled "Wide bandgap transistors with multiple field plates," issued Aug. 11, 2009; U.S. Pat. No. 6,316,793, entitled "Nitride based transistors on semi-insulating silicon carbide substrates" issued Nov. 13, 2001, U.S. Pat. No. 6,586,781 entitled "Group III nitride based FETs and HEMTs with reduced trapping and method for producing the same" issued Jul. 1, 2003, U.S. Pat. No. 6,548,333 entitled "Aluminum gallium nitride/gallium nitride high electron mobility transistors having a gate contact on a gallium nitride based cap segment" issued Apr. 15, 2003; U.S. Publication No. 2002/0167023 entitled "Group-III nitride based high electron mobility transistor (HEMT) with barrier/spacer layer" published Nov. 14, 2002; and U.S. Publication No. 2003/0020092 entitled "Insulating gate AlGaN/GaN HEMT" published on Jan. 30, 2003. Some embodiments may use GaN-based transistors such as a model G28V3, a model G50V3, a model G28V4 and/or a model G40V4 of Cree, Inc., Durham, N.C., the assignee of the inventive subject matter. It will be further appreciated that MMIC Doherty amplifiers according to some embodiments may use active devices other than GaN HEMTs, such as other types of heterojunction transistors.

In some embodiments, the impedance inverter circuit 140 may not be matched to a load impedance, e.g., the impedance at the output combining node may not be substantially near 50 ohms, to allow optimization of loading of the base amplifier 120 and the peaking amplifier 130. The load matching circuit 160 may provide suitable matching to 50 ohms or other load impedances.

FIGS. 2-7 illustrate component circuits and layout of a MMIC Doherty amplifier according to some embodiments. In particular FIGS. 2-5 illustrate a power divider circuit 110', base amplifier 120', a peaking amplifier 130', an impedance inverter circuit 140' and a load matching circuit 160', respectively.

Figure 2:
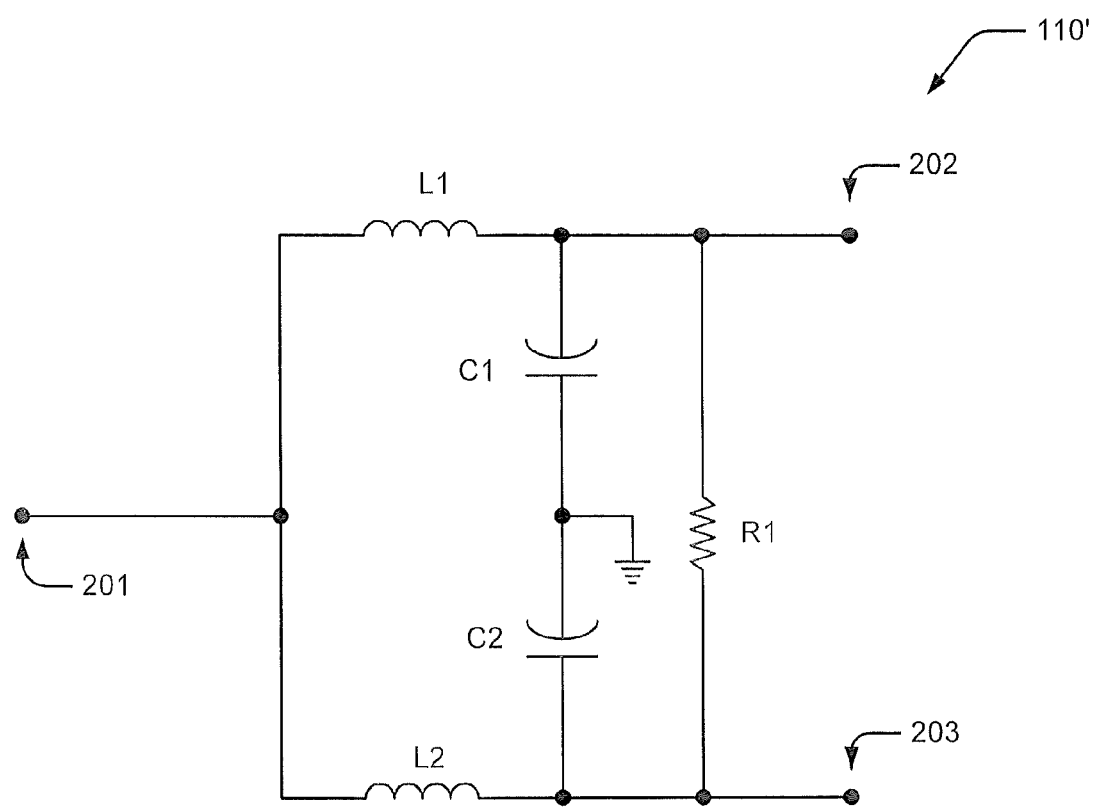
FIG. 2 is a schematic diagram illustrating a power divider for a MMIC Doherty amplifier according to some embodiments.

Referring to FIG. 2, the power divider 110' is a lumped Wilkinson divider including first and second lumped inductors L1, L2 coupled between respective output nodes 202, 203 and an input node 201 at which an RF signal is received. Respective capacitors C1, C2 are coupled between the output nodes 202, 203 and a ground node, and a resistor R1 is coupled between the output nodes 202, 203. It will be appreciated that, in some embodiments, such a power divider may be implemented using transmission line elements rather than the lumped implementation shown in FIG. 2. It will be appreciated that the power divider 110' may provide equal or unequal power division between the base and peaking amplifiers.

It will be understood that, generally, the power divider in a MMIC Doherty amplifier according to embodiments of the inventive subject matter controls the ratio of drive between the base and peaking amplifiers to control turn-on of the peaking amplifier. The power divider may also provide some phase matching between the base and peaking amplifiers to control the phase of currents provided at the output combining node by the amplifiers, e.g., so that they are in phase. It is generally desirable to provide an approximately 90 degree phase shift to the peaking amplifier to compensate for the phase shift introduced by the impedance inverter at the output of the base amplifier. The Wilkinson divider shown in FIG. 2 is an in-phase divider, however, so such phase shift may be provided by separate matching circuitry for the peaking amplifier, rather than by the power divider itself. In some embodiments, however, a quadrature or other phase shifting power divider may be used instead of an in-phase power divider, such that the matching circuitry for the peaking amplifier circuitry need not produce such a phase shift.

Figure 3:
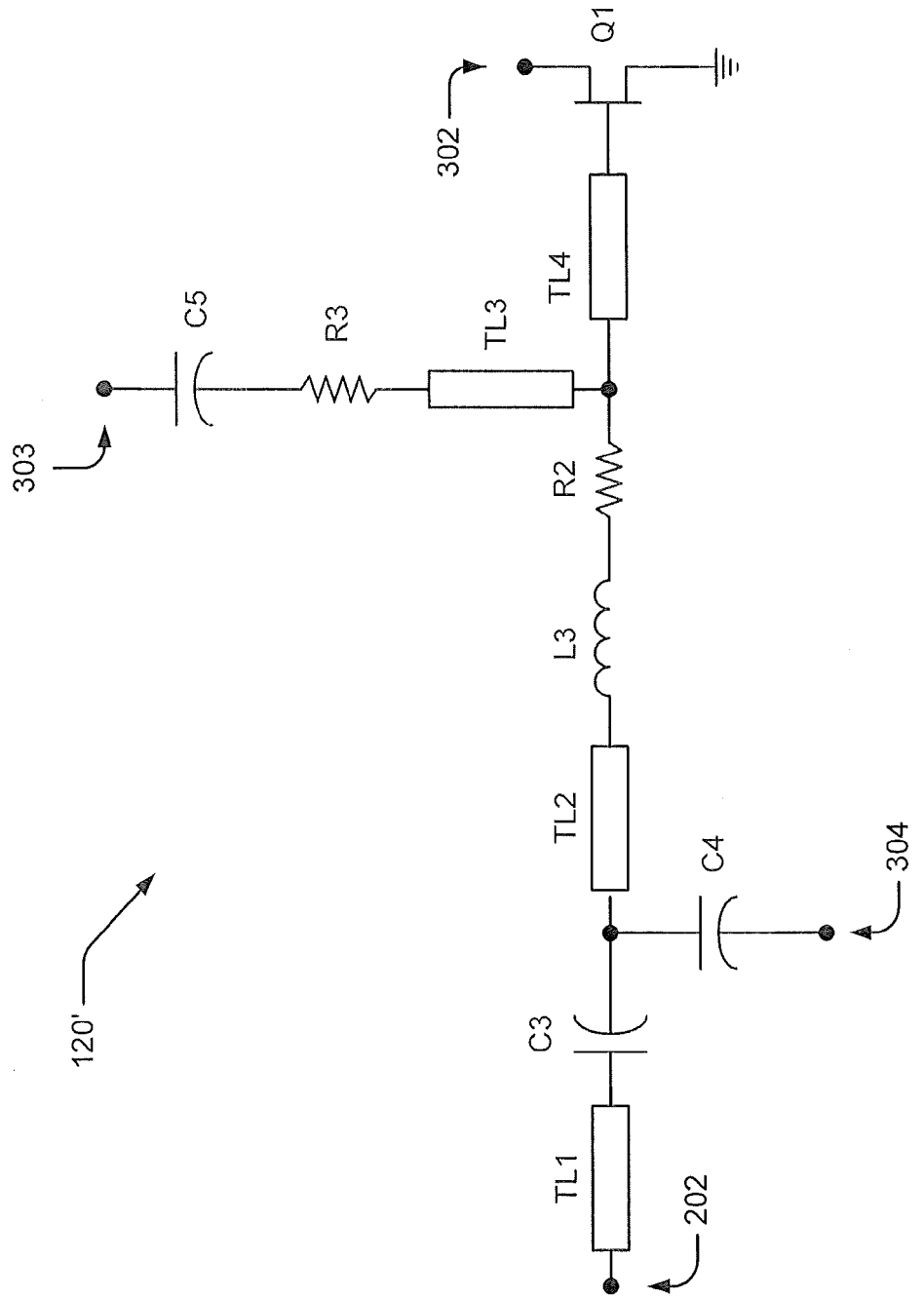
FIG. 3 is a schematic diagram illustrating a base amplifier for a MMIC Doherty amplifier according to some embodiments.

Referring to FIG. 3, the base amplifier 120' includes a GaN transistor Q1 having a source terminal coupled to a ground node and a drain terminal that serves as an output node 302 of the base amplifier 120'. Matching circuitry including resistors R3, R4, a lumped inductor L3, capacitors C3, C4, C5, and transmission line segments TL1, TL2, TL3, TL4 couple a gate terminal of the transistor Q1 to an input node 202 and biasing nodes 303, 304.

Figure 4:
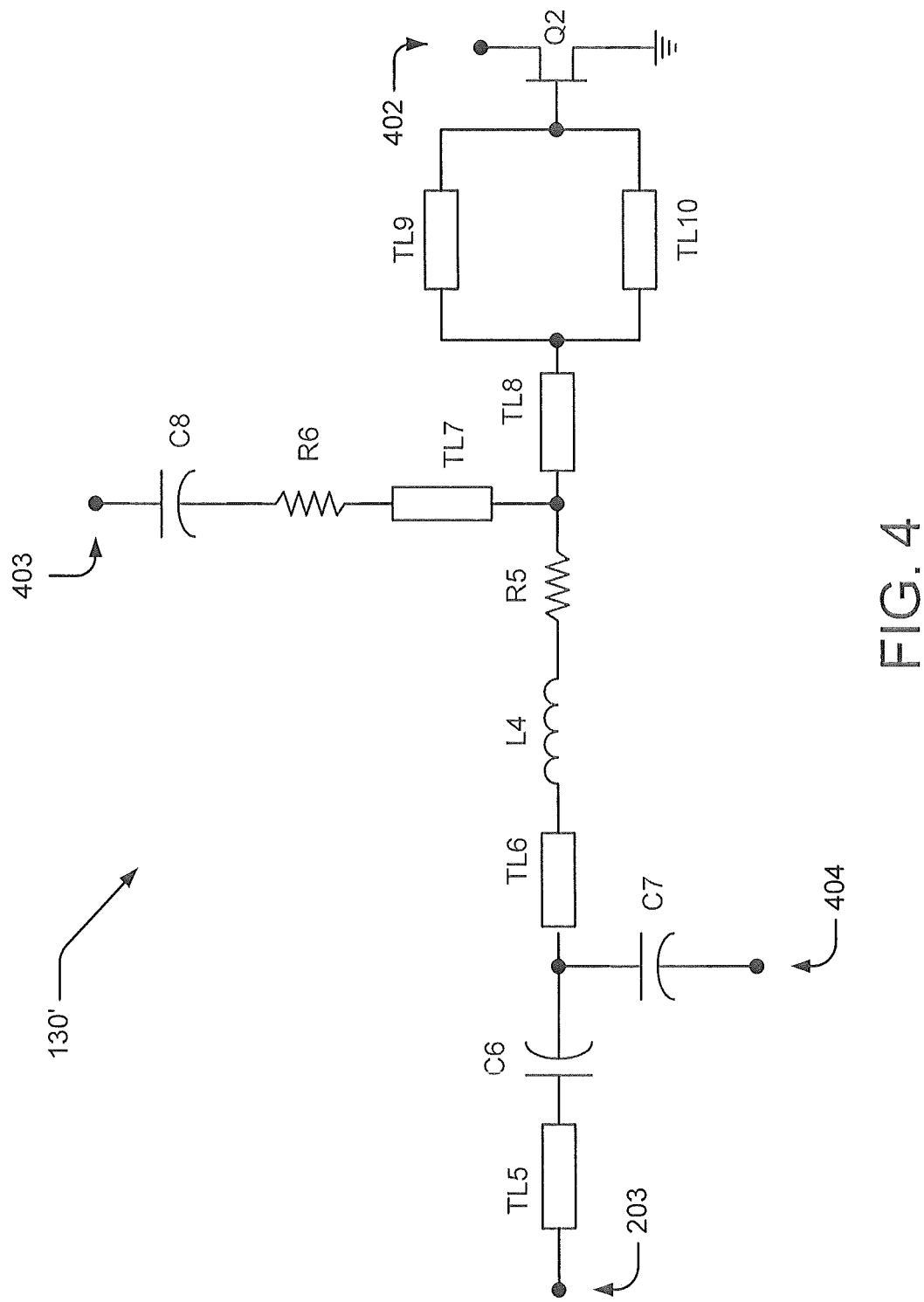
FIG. 4 is a schematic diagram illustrating a peaking amplifier for a MMIC Doherty amplifier according to some embodiments.

Referring to FIG. 4, the peaking amplifier 130' includes a GaN transistor Q2 having a source terminal coupled to a ground node and a drain terminal that serves as an output node 402 that also serves as an output combining node for the Doherty configuration. Matching circuitry including resistors R5, R6, a lumped inductor L4, capacitors C6, C7, C8, and transmission line segments TL5, TL6, TL7, TL8, TL9, TL10 couple a gate terminal of the transistor Q2 to an input node 203 and biasing nodes 403, 404.

Figure 5:
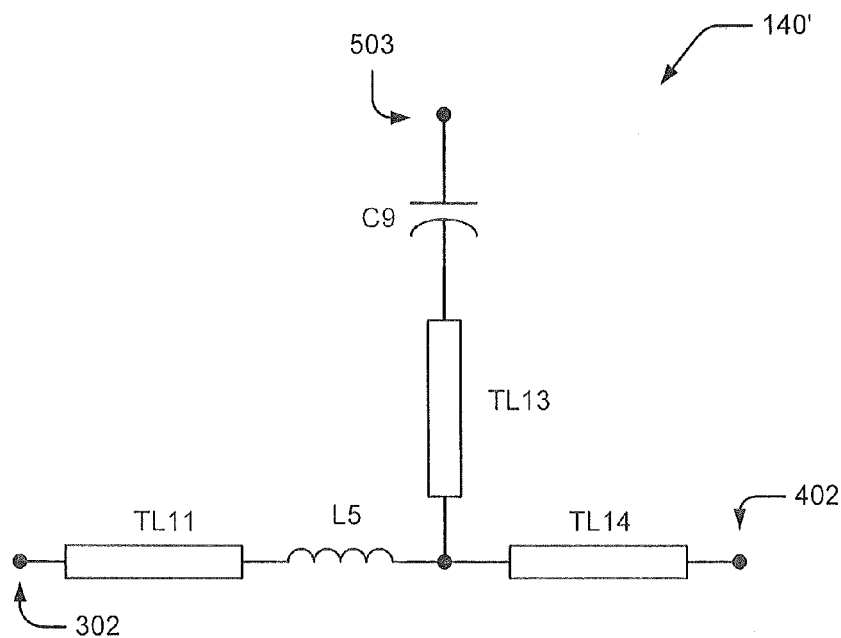
FIG. 5 is a schematic diagram illustrating an impedance inverter circuit for a MMIC Doherty amplifier according to some embodiments.

Referring to FIG. 5, the impedance inverter circuit 140' includes a lumped inductor L5 coupled between the base amplifier output node 302 and the peaking amplifier output node 402 (the output combining node). In particular, a first transmission line segment TL11 couples the base amplifier output node 402 to a first terminal of the lumped inductor L5 and a second transmission line segment TL12 couples a second terminal of the lumped inductor L5 to the peaking amplifier output node 402. A capacitor C9 has a first terminal coupled to a biasing node 503 and a second terminal coupled to the lumped inductor L5 via a third transmission line segment TL13.

Figure 6:
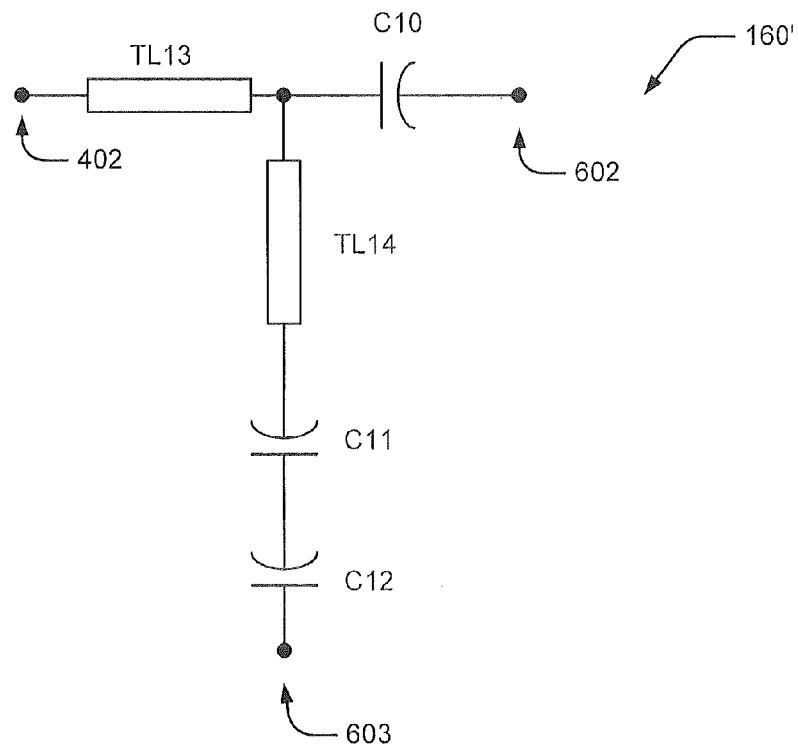
FIG. 6 is a schematic diagram illustrating a load matching circuit for a MMIC Doherty amplifier according to some embodiments.

Referring to FIG. 6, the load matching circuit 160' includes a first transmission line segment TL13 and a first capacitor C10 coupled in series between the output combining node 402 and an output node 602 at which the load is connected. A second transmission line segment TL14 and second and third capacitors C11, C12 couple the junction of the first transmission line segment TL14 and the first capacitor C10 to a biasing node 603.

Figure 7:
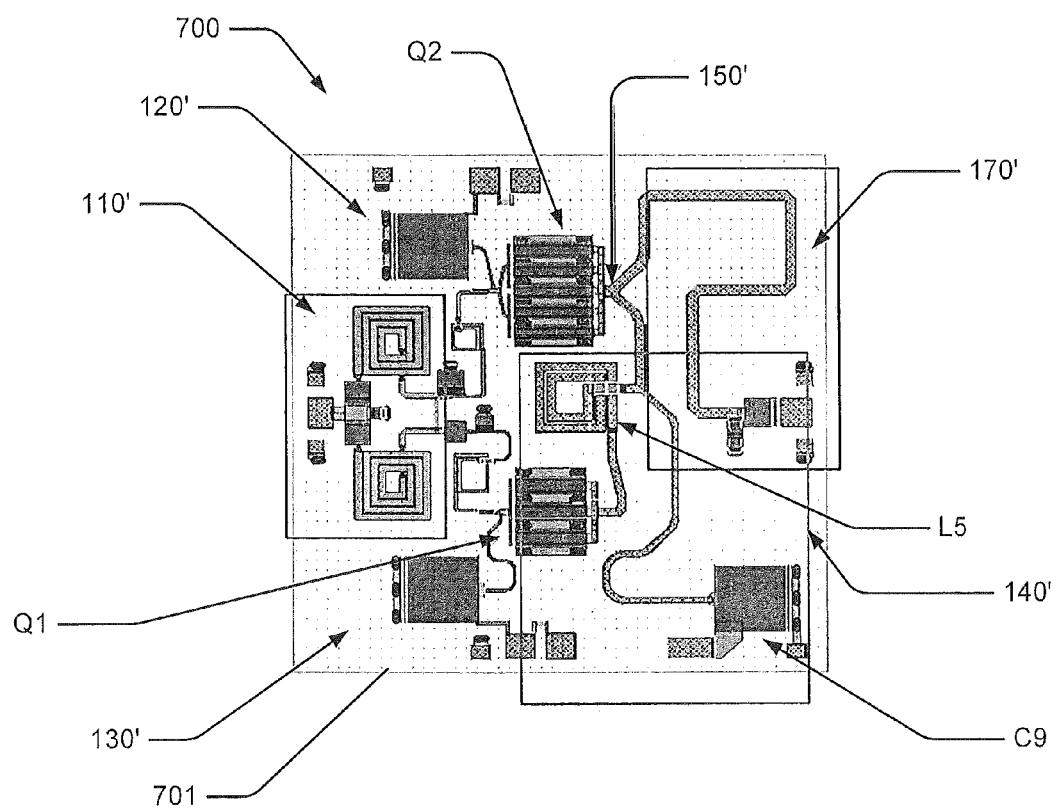
FIG. 7 illustrates a layout of a MMIC Doherty amplifier according to some embodiments.

FIG. 7 shows a layout of a MMIC 700 including circuitry corresponding to the power divider 110', the base amplifier 120', the peaking amplifier 130', the impedance inverter circuit 140' and the load matching circuit 160' described above, along with an input divider circuit 110'. FIG. 7 particularly identifies selected components of the base amplifier 120', the peaking amplifier 130', the impedance inverter circuit 140', including the GaN transistors Q1, Q2 of the base amplifier 120' and the peaking amplifier 130', respectively, and the lumped inductor L5 (implemented as a spiral inductor) and capacitor C9 of the impedance inverter circuit 140'. The first GaN transistor Q1 of the base amplifier 120' has a gate periphery of about 2.6 mm, and the second GaN transistor Q2 of the peaking amplifier 130' has a gate periphery of about 5 mm. These components are disposed on a substrate 701, which can be made of many different materials, such as various types of silicon carbide. Silicon carbide provides a relatively close crystal lattice match to Group III nitrides, and may result in Group III nitride films of relatively high. Silicon carbide also has a relatively high thermal conductivity so that the total output power of Group III nitride devices on silicon carbide may not be unduly limited by the thermal dissipation of the substrate. A silicon carbide substrate may also provide capacity for device isolation and reduced parasitic capacitance. Suitable SiC substrates are available from Cree, Inc., of Durham, N.C.

Figure 8:
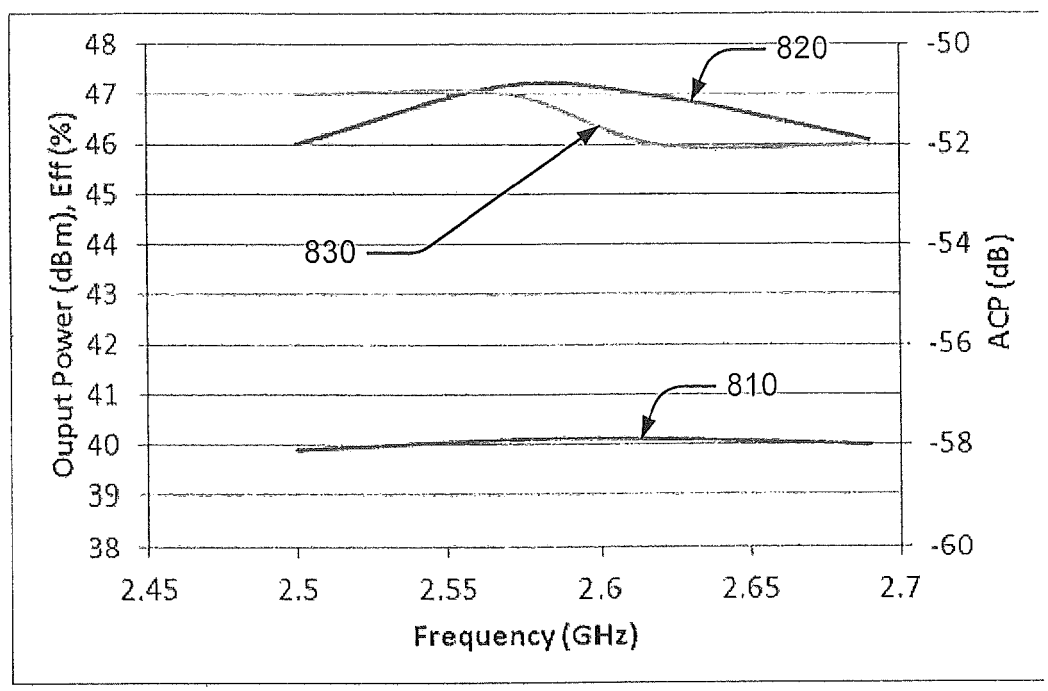
FIG. 8 is a graph illustration performance characteristics of a MMIC Doherty amplifier according to some embodiments.

Devices corresponding to the MMIC 700 formed using a 50 volt 0.4 µm gate process on a SiC substrate to produce a die having dimensions of about 3.4 mm by about 3.4 mm (about 11.6 mm$^2$) have been evaluated. FIG. 8 illustrates performance characteristics of an evaluated device using a WCDMA input signal having a peak to average power ratio of about 7.5, showing average output power 810 (peak power should be around 7.5 dB higher), efficiency 820 and adjacent channel power (ACP) 830 for a range of frequencies from about 2.5 GHz to about 2.7 GHz. As shown, the evaluated device exhibits efficiency of greater than 45% at an average output power level at and above 10 W (40 dBm). The peak single tone power of the amplifier is about 56 W. MMIC Doherty amplifiers according to some embodiments may produce at least about 10 watts of peak output power and at least about 35% efficiency at average output power levels about 7 dB below peak at frequencies of at least about 1 GHz.

Figure 9:
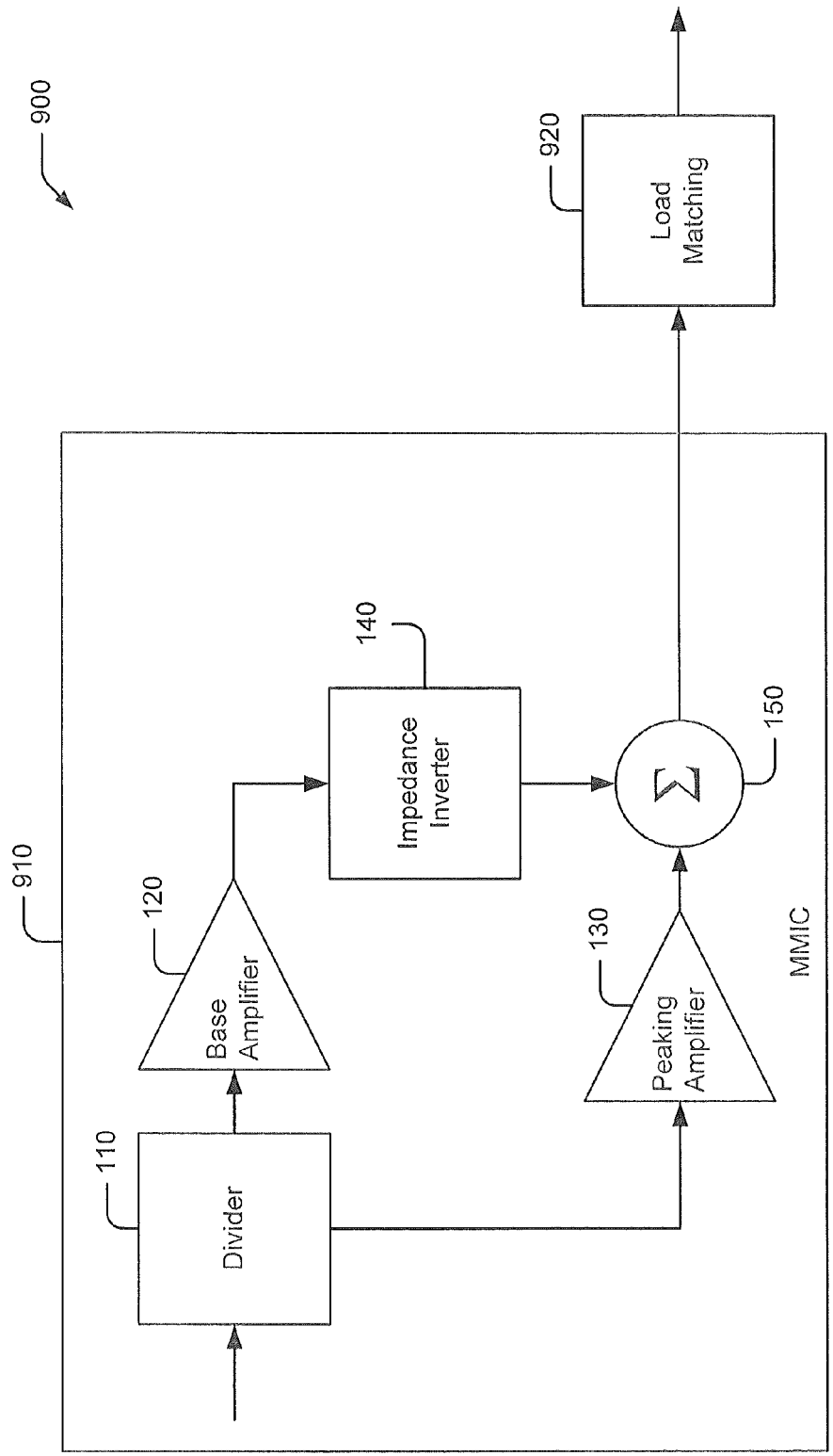
FIG. 9 is a schematic diagram of system including a MMIC Doherty amplifier with external matching circuit according to further embodiments.

According to further embodiments, a Doherty amplifier MMIC may be configured to be used with an external load matching circuit. Referring to FIG. 9, a system 900 may include a MMIC 910 including a power divider 110, a base amplifier 120, a peaking amplifier 130 and an impedance inverter circuit 140 that couples an output of the base amplifier 120 to an output combining node 150. The output combining node 150 may be configured to be connected to an external load matching circuit 920.

Figure 10:
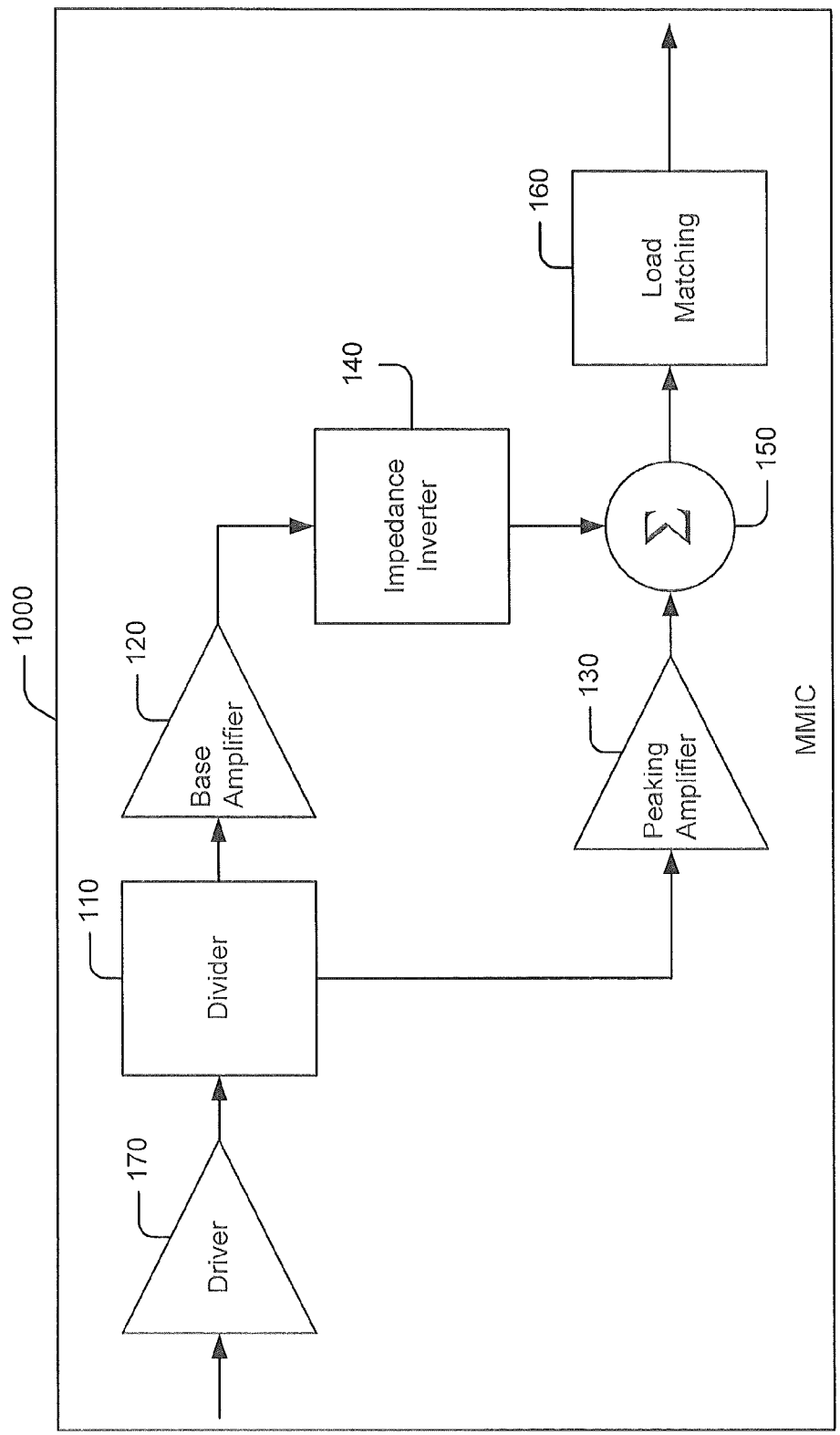
FIG. 10 is a schematic diagram of system including a MMIC Doherty amplifier with an integrated input driver circuit according to further embodiments.

According to yet further embodiments, a Doherty amplifier MMIC may include an integrated input driver stage. Referring to FIG. 10, a system 1000 may include a MMIC 1000 includes a power divider 110, a base amplifier 120, a peaking amplifier 130, an impedance inverter circuit 140 that couples an output of the base amplifier 120 to an output combining node 150 and a load matching circuit 160. The MMIC 1000 further includes an input driver 170 configured to receive an input RF signal and having an output coupled to the input of the power divider 110. The input driver 170 may be, for example, a Class A or B amplifier, and may be used to increase overall gain.

Applications of MMICs according to some embodiments of the inventive subject matter include transmitter circuits for wireless communications systems, such as in wireless base stations.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A monolithic microwave integrated circuit (MMIC) comprising:
   a silicon carbide (SiC) substrate; and
   a power amplifier comprising:
   a power divider circuit on the substrate and having an input configured to receive an input RF signal;
   a base amplifier on the substrate and having an input coupled to a first output of the power divider circuit;
   a peaking amplifier on the substrate and having an input coupled to a second output of the power divider circuit and an output coupled to an output combining node;
   an impedance inverter circuit on the substrate coupling an output of the base amplifier to the output combining node; and
   a load matching circuit on the substrate and having an input coupled to the output combining node and an output configured to be coupled to an external load, wherein the impedance inverter circuit comprises:
   a first transmission line segment having a first terminal coupled to the output of the base amplifier;
   a spiral inductor having a first terminal coupled to a second terminal of the first transmission line;
   a second transmission line segment having a first terminal coupled to a second terminal of the spiral inductor and a second terminal coupled to the output combining node;
   a third transmission line segment having a first terminal coupled to the second terminal of spiral inductor and to the first terminal of the second transmission line segment; and
   a capacitor having a first terminal coupled to a second terminal of the third transmission line segment and a second terminal coupled to a biasing node.

2. The MMIC of claim 1, wherein the impedance inverter circuit prioritizes optimization of loading of the base and peaking amplifiers over matching of the output combining node to the load.

3. The MMIC of claim 1, wherein an impedance at the output combining node is substantially different than 50 ohms.

4. The MMIC of claim 1, wherein the impedance inverter circuit comprises at least one lumped inductor coupled between the output of the base amplifier and the output combining node.

5. The MMIC of claim 4, wherein the at least one lumped inductor comprises a spiral inductor.

6. The MMIC of claim 4, wherein the impedance inverter circuit comprises at least one capacitor coupled between the output combining node and a biasing node.

7. The MMIC of claim 1 configured to provide an average output power of at least about 10 W and a gain of at least about 15 dB in a range of frequencies from about 2.5 GHz to about 2.7 GHz.

8. The MMIC of claim 1, wherein the substrate has an area of less than about 15 mm$^2$ and wherein the MMIC is configured to provide an average output power of at least about 10 W.

9. The MMIC of claim 1, further comprising an input driver circuit on the substrate and having an input configured to receive an input RF signal and an output coupled to the input of the power divider circuit.

10. The MMIC of claim 1:
wherein the base amplifier is a single-transistor base amplifier; and
wherein the peaking amplifier is a single-transistor peaking amplifier.

11. A monolithic microwave integrated circuit (MMIC) comprising:
a silicon carbide (SiC) substrate; and
a power amplifier comprising:
a power divider circuit on the substrate and having an input configured to receive an input RF signal;
a base amplifier comprising a first Group III-nitride based transistor on the substrate and having an input coupled to a first output of the power divider circuit;
a peaking amplifier comprising a second Group III-nitride based transistor on the substrate and having an input coupled to a second output of the power divider circuit and an output coupled to an output combining node;
an impedance inverter circuit on the substrate coupling an output of the base amplifier to the output combining node; and
a load matching circuit on the substrate and having an input coupled to the output combining node and an output configured to be coupled to an external load, wherein the impedance inverter circuit comprises:
a first transmission line segment having a first terminal coupled to the output of the base amplifier;
a spiral inductor having a first terminal coupled to a second terminal of the first transmission line;
a second transmission line segment having a first terminal coupled to a second terminal of the spiral inductor and a second terminal coupled to the output combining node;
a third transmission line segment having a first terminal coupled to the second terminal of spiral inductor and to the first terminal of the second transmission line segment; and
a capacitor having a first terminal coupled to a second terminal of the third transmission line segment and a second terminal coupled to a biasing node.

12. The MMIC of claim 1:
wherein the base amplifier comprises a first Group III-nitride based transistor; and
wherein the peaking amplifier comprises a second Group II-nitride based transistor.

13. The MMIC of claim 12, wherein the first and second Group III-nitride based transistors comprise respective first and second gallium nitride (GaN) high electron mobility transistors (HEMTs).

14. The MMIC of claim 13, wherein the first GaN HEMT has a gate periphery in a range from about 2 mm to about 3 mm and wherein the second GaN HEMT has a gate periphery in a range from about 4 mm to about 6 mm.

15. The MMIC of claim 13:
wherein the output of the base amplifier comprises a drain of the first GaN HEMT; and
wherein the output of peaking amplifier comprises a drain of the second GaN HEMT.

16. The MMIC of claim 11:
wherein the first Group III-nitride based transistor is a first gallium nitride (GaN) high electron mobility transistor (HEMT) having a gate periphery in a range from about 2 mm to about 3 mm; and
wherein the second Group III-nitride based transistor is a second GaN HEMT having a gate periphery in a range from about 4 mm to about 6 mm; and wherein the substrate is a silicon carbide (SiC) substrate having an area of less than about 15 mm$^2$.

17. The MMIC of claim 16, wherein the MMIC provides an average output power of at least about 10 W and a gain of at least about 15 dB in a range of frequencies from about 2.5 GHz to about 2.7 GHz.

18. A monolithic microwave integrated circuit (MMIC) comprising:
a silicon carbide (SiC) substrate; and
a power amplifier comprising:
a power divider circuit on the substrate and having an input configured to receive an input RF signal;
a base amplifier on the substrate and having an input coupled to a first output of the power divider circuit;
a peaking amplifier on the substrate and having an input coupled to a second output of the power divider circuit and an output coupled to an output combining node;
an impedance inverter circuit on the substrate coupling an output of the base amplifier to the output combining node;
a load matching circuit on the substrate and having an input coupled to the output combining node and an output configured to be coupled to an external load and comprising:
a first transmission line segment having a first terminal coupled to the output combining node;
a first capacitor having a first terminal coupled to a second terminal of the first transmission line segment and a second terminal configured to be coupled to the external load;
a second transmission line segment having a first terminal coupled to the first terminal of the first capacitor and the second terminal of the first transmission line segment; and
a second capacitor coupled between a second terminal of the second transmission line segment and a second biasing node.

19. The MMIC of claim 18 configured to provide an average output power of at least about 10 W and a gain of at least about 15 dB in a range of frequencies from about 2.5 GHz to about 2.7 GHz.

20. The MMIC of claim 18, wherein the substrate has an area of less than about 15 mm$^2$ and wherein the MMIC is configured to provide an average output power of at least about 10 W.

21. The MMIC of claim 18, further comprising an input driver circuit on the substrate and having an input configured to receive an input RF signal and an output coupled to the input of the power divider circuit.

22. The MMIC of claim 18, wherein the power divider circuit comprises an in-phase power divider circuit and wherein the peaking amplifier comprises a phase-shifting input matching circuit.

23. The MMIC of claim 22, wherein the power divider circuit comprises a Wilkinson divider.

24. A monolithic microwave integrated circuit (MMIC) comprising:
a substrate; and
a power amplifier comprising:
a power divider circuit on the substrate and having an input configured to receive an input RF signal;
a base amplifier on the substrate and having an input coupled to a first output of the power divider circuit;
a peaking amplifier on the substrate and having an input coupled to a second output of the power divider circuit and an output coupled to an output combining node; and an impedance inverter circuit on the substrate coupling an output of the base amplifier to the output combining node and comprising a lumped inductor coupled between the output of the base amplifier and the output combining node and a capacitor coupled between the output combining node and a biasing node, wherein the impedance inverter circuit comprises:
- a first transmission line segment having a first terminal coupled to the output of the base amplifier and second terminal coupled to a first terminal of the lumped inductor;
- a second transmission line segment coupled between a second terminal of the lumped inductor and the output combining node;
- a third transmission line segment having a first terminal coupled to the second terminal of the lumped inductor and a second terminal coupled to the capacitor.

25. The MMIC of claim 24, wherein the capacitor comprises a first capacitor, wherein the biasing node comprises a first biasing node, and further comprising a load matching circuit comprising:
- a fourth transmission line segment having a first terminal coupled to the output combining node;
- a second capacitor having a first terminal coupled to a second terminal of the fourth transmission line segment and a second terminal configured to be coupled to the external load;
- a fifth transmission line segment having a first terminal coupled to the first terminal of the second capacitor and the second terminal of the fourth transmission line segment; and
- a third capacitor coupled between a second terminal of the fifth transmission line segment and biasing node.

26. A monolithic microwave integrated circuit (MMIC) comprising:
- a silicon carbide (SiC) substrate; and
- a power amplifier comprising:
- a power divider circuit on the substrate and having an input configured to receive an input RF signal;
- a base amplifier comprising a first Group III-nitride based transistor on the substrate and having an input coupled to a first output of the power divider circuit;
- a peaking amplifier comprising a second Group III-nitride based transistor on the substrate and having an input coupled to a second output of the power divider circuit and an output coupled to an output combining node;
- an impedance inverter circuit on the substrate coupling an output of the base amplifier to the output combining node and comprising a lumped inductor coupled between the output of the base amplifier and the output combining node and a first capacitor coupled between the output combining node and a biasing node; and
- a load matching circuit on the substrate and having an input coupled to the output combining node and an output configured to be coupled to an external load, wherein the load matching circuit comprises:
- a first transmission line segment having a first terminal coupled to the output combining node;
- a second capacitor having a first terminal coupled to a second terminal of the first transmission line segment and a second terminal configured to be coupled to the external load;
- a second transmission line segment having a first terminal coupled to the first terminal of the second capacitor and the second terminal of the first transmission line segment; and
- a third capacitor coupled between a second terminal of the second transmission line segment and a second biasing node.

27. The MMIC of claim 26, wherein the impedance inverter circuit further comprises a transmission line segment coupled in series with the lumped inductor.

28. The MMIC of claim 26, wherein the impedance inverter circuit further comprises:
- a first transmission line segment coupling the output of the base amplifier to the lumped inductor; and
- a second transmission line segment coupling the lumped inductor to the output combining node.

29. The MMIC of claim 26, wherein the impedance inverter circuit further comprises a transmission line segment coupled in series with the at least one capacitor.

30. The MMIC of claim 26, wherein the lumped inductor comprises a spiral inductor.

31. The MMIC of claim 26, wherein the first and second Group III-nitride transistors comprise respective first and second gallium nitride (GaN) high electron mobility transistors (HEMTs).

32. The MMIC of claim 31, wherein the first GaN HEMT has a gate periphery in a range from about 2 mm to about 3 mm and wherein the second GaN HEMT has a gate periphery in a range from about 4 mm to about 6 mm.

33. The MMIC of claim 31:
- wherein the output of the base amplifier comprises a drain of the first GaN HEMT; and
- wherein the output of peaking amplifier comprises a drain of the second GaN HEMT.

34. The MMIC of claim 26:
- wherein the first Group III-nitride based transistor is a first gallium nitride (GaN) high electron mobility transistor (HEMT) having a gate periphery in a range from about 2 mm to about 3 mm;
- wherein the second Group III-nitride based transistor is a second GaN HEMT having a gate periphery in a range from about 4 mm to about 6 mm; and
- wherein the substrate is a silicon carbide (SiC) substrate having an area of less than about 15 $mm^2$.

35. The MMIC of claim 34, wherein the MMIC provides an average output power of at least about 10 W and a gain of at least about 15 dB in a range of frequencies from about 2.5 GHz to about 2.7 GHz.

* * * * *